(12) United States Patent
Park et al.

(10) Patent No.: US 8,246,747 B2
(45) Date of Patent: Aug. 21, 2012

(54) APPARATUS FOR MANUFACTURING SEMICONDUCTOR

(75) Inventors: Sang Joon Park, Yongin-si (KR); Young Jun Kim, Pyeongtaek-si (KR)

(73) Assignee: Wonik IPS Co., Ltd., Pyeongtaek-si (KR)

( * ) Notice: Subject to any disclaimer, the term of this patent is extended or adjusted under 35 U.S.C. 154(b) by 0 days.

(21) Appl. No.: 13/347,896

(22) Filed: Jan. 11, 2012

(65) Prior Publication Data

US 2012/0103260 A1   May 3, 2012

Related U.S. Application Data

(63) Continuation of application No. PCT/KR2010/004104, filed on Jun. 24, 2010.

(30) Foreign Application Priority Data

Jul. 16, 2009  (KR) .................. 10-2009-0064952

(51) Int. Cl.
C23C 16/00 (2006.01)
C23C 16/455 (2006.01)
C23C 16/458 (2006.01)
C23C 16/46 (2006.01)

(52) U.S. Cl. ..................... 118/715; 118/724; 118/725
(58) Field of Classification Search .................. 118/715, 118/724, 725
See application file for complete search history.

(56) References Cited

U.S. PATENT DOCUMENTS

| 3,696,779 | A | * | 10/1972 | Murai et al. | 118/725 |
| 4,421,786 | A | * | 12/1983 | Mahajan et al. | 117/101 |
| 4,854,266 | A |  | 8/1989 | Simson et al. |  |
| 5,062,386 | A | * | 11/1991 | Christensen | 118/725 |
| 5,888,303 | A | * | 3/1999 | Dixon | 118/715 |
| 6,099,650 | A | * | 8/2000 | Carbonaro et al. | 118/715 |
| 6,148,832 | A |  | 11/2000 | Gilmer et al. |  |
| 7,570,876 | B2 | * | 8/2009 | De Ridder | 392/416 |
| 7,625,205 | B2 | * | 12/2009 | Sasajima et al. | 432/253 |
| 7,891,975 | B2 | * | 2/2011 | Sasajima et al. | 432/259 |
| 2003/0044533 | A1 | * | 3/2003 | Lee | 427/255.28 |
| 2009/0197424 | A1 | * | 8/2009 | Sakai et al. | 438/758 |
| 2011/0151138 | A1 | * | 6/2011 | Shiono et al. | 427/551 |
| 2012/0076936 | A1 | * | 3/2012 | Hirano | 427/248.1 |

FOREIGN PATENT DOCUMENTS

| EP |   636705 | A2 | * | 2/1995 |
| JP | 54020971 | A  | * | 2/1979 |
| JP | 59000919 | A  | * | 1/1984 |
| JP | 61019119 | A  | * | 1/1986 |
| JP | 63043315 | A  | * | 2/1988 |
| JP | 01123413 | A  | * | 5/1989 |

(Continued)

*Primary Examiner* — Jeffrie R Lund

(74) *Attorney, Agent, or Firm* — NSIP Law

(57) ABSTRACT

Disclosed is an apparatus for manufacturing semiconductors, to be used for various processes in semiconductor manufacture processing, such as the forming of layers on wafers. A tube has a processing space therein and a discharge hole at a side thereof. A boat can be loaded and unloaded through a lower opening of the tube. Susceptors are vertically separated from one another and supported within the boat, have a central hole defined in the respective centers of rotation thereof, and have a plurality of wafers stacked around a central perimeter on the respective top surfaces thereof. A supply tube is installed at the top of the boat and passes through each central hole of the susceptors, and defines discharge holes for discharging processing gas supplied from the outside onto each top surface of the susceptors.

7 Claims, 8 Drawing Sheets

FOREIGN PATENT DOCUMENTS

| | | | |
|---|---|---|---|
| JP | 02103928 A | * | 4/1990 |
| JP | 02174114 A | * | 7/1990 |
| KN | 10-2009-00553046 | | 6/2009 |
| KR | 10-0539386 | | 12/2005 |
| KR | 10-0705267 | | 4/2007 |

* cited by examiner

APPARATUS FOR MANUFACTURING SEMICONDUCTOR

CROSS-REFERENCE TO RELATED APPLICATION

This application is a continuation of International Patent Application No. PCT/KR2010/004104, filed on Jun. 24, 2010, which claims the benefit of Korean Patent Application No. 10-2009-0064952, filed on Jul. 16, 2009, the entire disclosure of which are incorporated herein by reference for all purposes.

BACKGROUND

1. Field

The following description relates to an apparatus for manufacturing a semiconductor, which is used in the course of various semiconductor manufacturing procedures including forming a film on a wafer.

2. Description of the Related Art

Generally, a semiconductor manufacturing apparatus is used for various semiconductor manufacturing procedures including annealing, diffusion, oxidation, and chemical vapor deposition. Furnaces as semiconductor manufacturing apparatuses can be divided into two kinds in which vertical or horizontal furnaces are used.

As a low pressure chemical vapor deposition furnace, a vertical type furnace is more often employed than a horizontal type furnace because the vertical type furnace produces fewer fine impurities such as particles than the horizontal type furnace. In addition, the vertical type furnace has a process tube positioned vertically so that a bottom area occupied by a lower strut can be beneficially reduced.

A conventional vertical type furnace will be described with reference to FIG. 1.

Referring to FIG. 1, a vertical type furnace 10 includes a heating chamber 11 having a heater, an outer tube 12, an inner tube 13, a flange 14, a boat 15, and a nozzle 16. The outer tube 12 is installed inside the heating chamber 11, the inner tube 13 is installed inside the outer tube 12, and the outer tube 12 and the inner tube 13 are mounted on the flange 14. The boat 15 is mounted in the inner tube 13 and in the boat, wafers W are loaded. The nozzle 16 is installed on the flange 14 and a process gas is injected through the nozzle 16 from an external source. The process gas ejected from the nozzle 16 flows between the boat 15 and the inner tube 13 to form a film on each wafer.

In the example shown in FIG. 1, the wafers W are loaded vertically in the boat 15 one by one. Thus, to increase productivity by processing more wafers W at one time, a larger number of wafers W should be loaded. Then, a height of the loaded wafers W is increased and accordingly the time for the process gas to form a film on each wafer W can be increased. This may restrict the increase of the number of wafers W to be processed at one time.

Additionally, in the vertical type furnace 10 shown in FIG. 1, after the process gas is supplied from a lower portion forms a film on each wafer W while flowing between the boat 15 and the inner tube 13, residual gas passes over a top of the inner tube 13 and is discharged externally through a space between the inner tube 13 and the outer tube 12. In the above case, since the process gas is supplied to the wafers W while moving upwards, not all wafers have a uniform film formed thereon.

SUMMARY

In one general aspect, provided is an apparatus for manufacturing a semiconductor, the apparatus comprising: a tube configured to have a process space inside and a drain outlet at one end; a boat configured to be moved in and out of the tube through a open lower portion of the tube; a plurality of susceptors configured to be arranged apart from one another in a vertical direction, and each having a center hole on a rotation axis and having a top surface on which a plurality of wafers are loaded around a center; and a supply pipe configured to be installed to penetrate the center hole of each susceptor from a top of the boat and to have ejection nozzles, each ejecting a process gas provided from an external source to the top surface of each susceptor.

A plurality of wafers may be loaded on each of the susceptors arranged in a vertical direction, so that more wafers can be processed at one time compared to a conventional vertical furnace. Thus, the productivity can be increased.

In addition, the process gas may be ejected onto the top surface of each susceptor, and thus it is possible for the process gas to be provided to all wafers more evenly regardless of a location, compared to the conventional vertical furnace. Hence, a uniform film can be formed on each wafer.

Other features and aspects will be apparent from the following detailed description, the drawings, and the claims.

Figure 1:
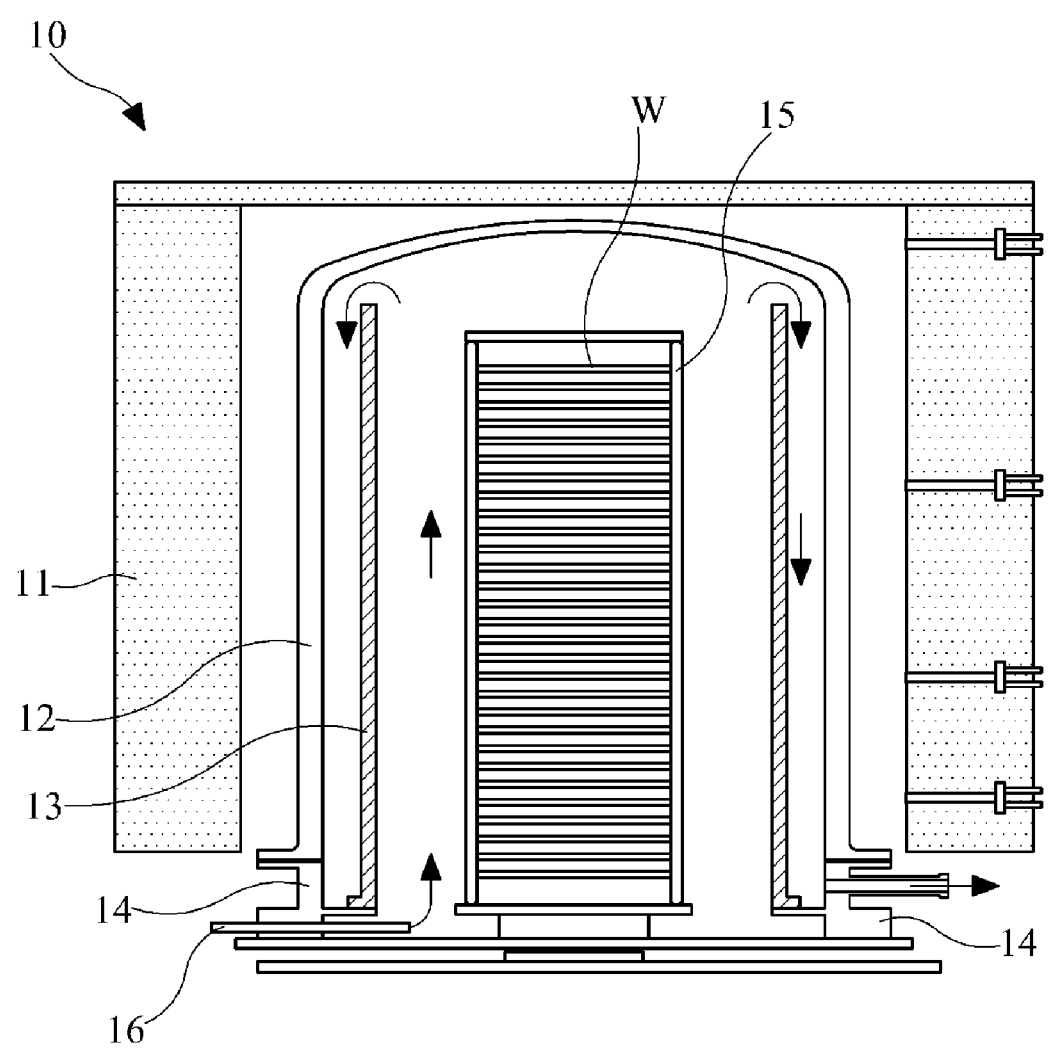
FIG. 1 is a cross-sectional view of an example of a vertical type furnace according to the prior art.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, is various changes, modifications, and equivalents of the methods, apparatuses, and/or systems described herein will be suggested to those of ordinary skill in the art. Also, descriptions of well-known functions and constructions may be omitted for increased clarity and conciseness.

Figure 2:
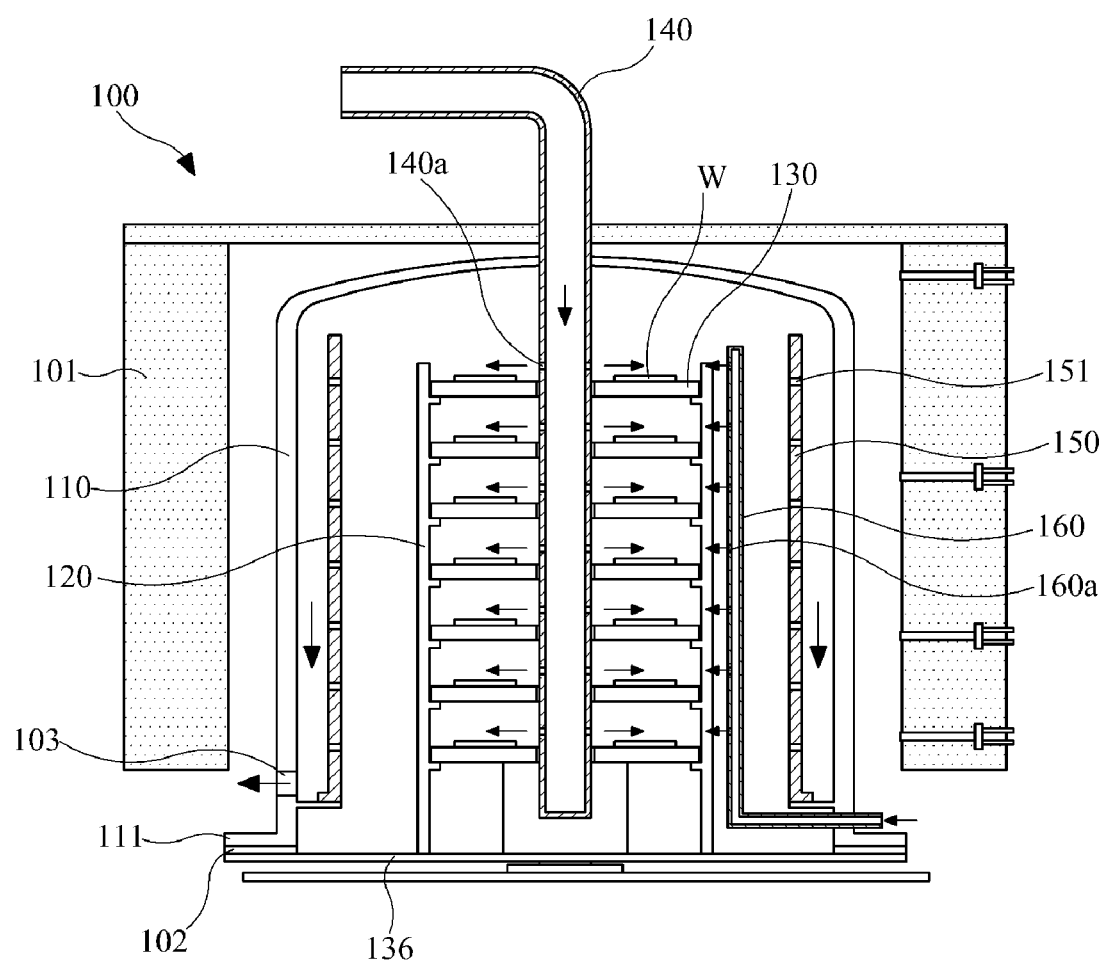
FIG. 2 is a cross-sectional view of an apparatus for manufacturing a semiconductor according to an exemplary embodiment of the present invention.
Figure 3:
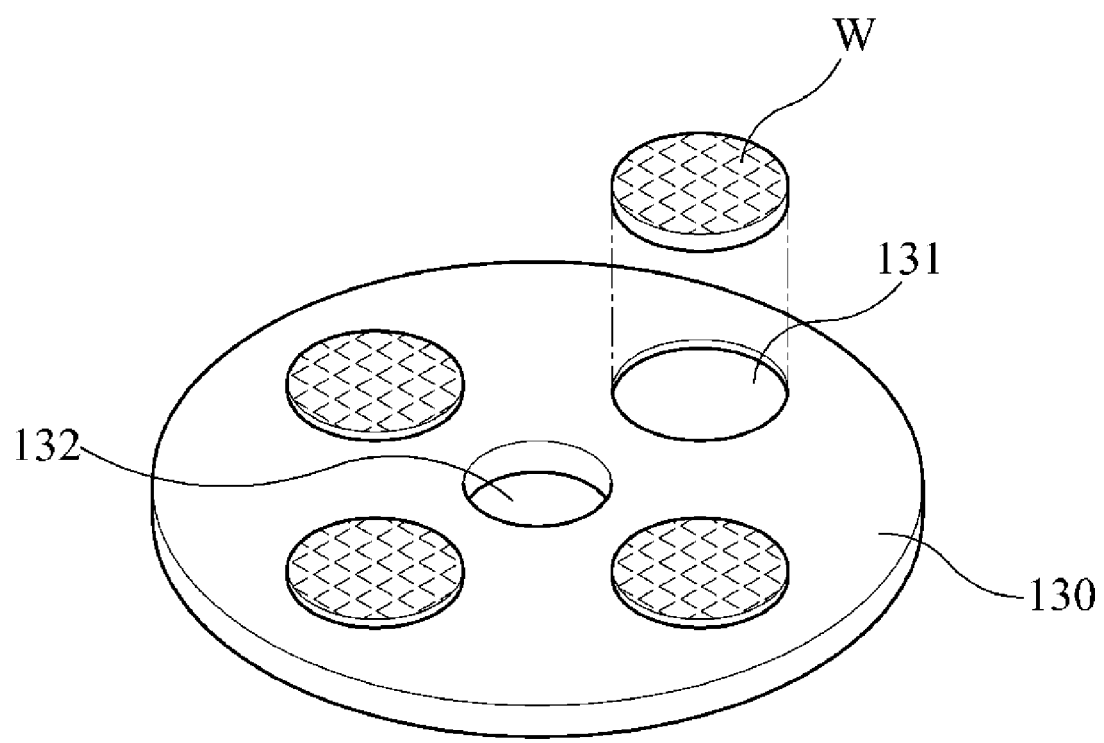
FIG. 3 is a perspective view of a susceptor shown in FIG. 2.

FIG. 2 illustrates an example of a cross-sectional view of an apparatus for manufacturing a semiconductor. FIG. 3 illustrates an example of a perspective view of one of susceptors included in the apparatus of FIG. 2.

Referring to FIGS. 2 and 3, the apparatus 100 for manufacturing a semiconductor includes a tube 110, a boat 120, susceptors 130, a supply pipe 140, and a baffle 150.

The tube 110 has a space for processing and a drain outlet 103 at one end. The process may include annealing, diffusion, oxidation, chemical vapor deposition, and the like. The tube 110 is supplied with process gas through the supply pipe 140. The tube 110 may be configured to have an upper portion closed and a lower portion open. The boat 120 may be moved in and out of the tube 110 through the open lower portion of the tube 110. The drain outlet 103 may be disposed on a lower end of the tube 110 to discharge the process gas out of the tube 110. The boat 120 may be moved in and out of the tube 110 by an elevating device (not shown). When the boat 120 is placed in the tube 110, the inner space of the tube 110 may be sealed by a sealing unit 102.

The sealing unit 102 may be interposed between a flange 111 and a boat supporting stand 136. The flange 111 extends outwards from a lower edge of the tube 110, and the boat supporting stand 136 is formed to support the boat 120 at the bottom of the boat 120.

The heating chamber 101 may be disposed to enclose around the tube 110. The heating chamber 101 heats up the tube 110 and maintains a temperature inside the tube 110 to a set temperature. To this end, the heating chamber 101 may include a heater (not shown).

A plurality of susceptors 130 may be provided. The susceptors 130 are disposed in the boat 120 a predetermined distance from one another in a stacked manner. The susceptors 130 may be supported by projection portions which are formed in the boat 120 to be spaced a predetermined distance apart from one another in a vertical direction.

Each susceptor 130 may have a center hole 132 for the supply pipe 140 to be inserted and installed therein. Each susceptor 130 is configured to have a plurality of wafers W disposed on its top surface around the center hole 132.

To this end, as shown in FIG. 3, each susceptor 130 may be in a circular form. Also, each susceptor 130 may have wafer receiving portions 131 to house the wafers W. Each of the wafer receiving portions 130 may be formed as a recess to receive the wafer W.

The supply pipe 140 may be installed to penetrate the center holes 132 of the susceptors 130 from the top of the boat 120. The supply pipe 140 is installed detachably from the susceptors 130 by penetrating the center holes 132. Therefore, while the supply pipe 140 is fixed to the tube 110, the susceptors 130 supported by the boat 120 can be freely moved in and out through the open lower portion of the tube 110.

The supply pipe 140 is provided with process gas from an external source and ejects the process gas to supply it to the wafers W. The supply pipe 140 may have an upper end which penetrates the tube 110 and the heating chamber 101 so that the supply pipe 140 can be connected with an external gas provider, and be provided with the process gas from the external gas provider. In another example, the supply pipe 140 may have an upper end connected with a gas supply channel disposed inside the tube 110 to be provided with the process gas. The gas supply channel may be connected with an external gas provider.

The supply pipe 140 has a plurality of ejection nozzles 140a to eject the process gas to a top surface of each susceptor 130. The ejection nozzles 140a may be assigned to the susceptors 130 one by one or in groups.

Operations of the above apparatus 100 will now be described below.

First, while an empty boat 120 is moved out of the tube 110 by an elevating device, the susceptors 130 having wafers W loaded thereon are loaded into the boat 120. Once the susceptors 130 are completely loaded in the boat 120, the boat 120 is moved into the tube 110 by the elevating device. The heating chamber 101 heats up the tube 110 to maintain the inside of the tube 110 at a set temperature. Heating the tube 110 may precede moving the boat 120 inside the tube 110.

While the boat 120 is placed inside the tube 110, the process gas is ejected into the tube 110 through the supply pipe 140. The process gas is ejected toward the top surface of each susceptor 130 through the ejection nozzles 140a of the supply pipe 140 to be provided to the wafers W. The process gas provided to the wafers W may form a film on each wafer W. Once the film is completely formed on each wafer W, the boat 120 is withdrawn from the tube 110 by the elevating device, and the susceptors 130 are unloaded from the boat 120.

As described above, each of the susceptors 130 arranged in a stacked manner may have a plurality of wafers W loaded thereon. Accordingly, compared to a case where wafers W are loaded on the susceptors 130 one by one, the susceptors 130 in the examples shown in FIGS. 2 and 3 can process more wafers W at a time under the assumption that the heights of the loaded wafers W are the same in both cases. Thus, productivity can be increased.

Furthermore, in the examples shown in FIGS. 2 and 3, the process gas may be ejected to the top surface of each susceptor 130. Hence, compared to a case where process gas is supplied to the wafers W while being moved upwardly from a bottom to a top of the tube 110, the process gas can be uniformly supplied to all wafers W regardless of their locations in the example shown in FIG. 2. Therefore, films can be uniformly formed on the individual wafers W.

Figure 4:
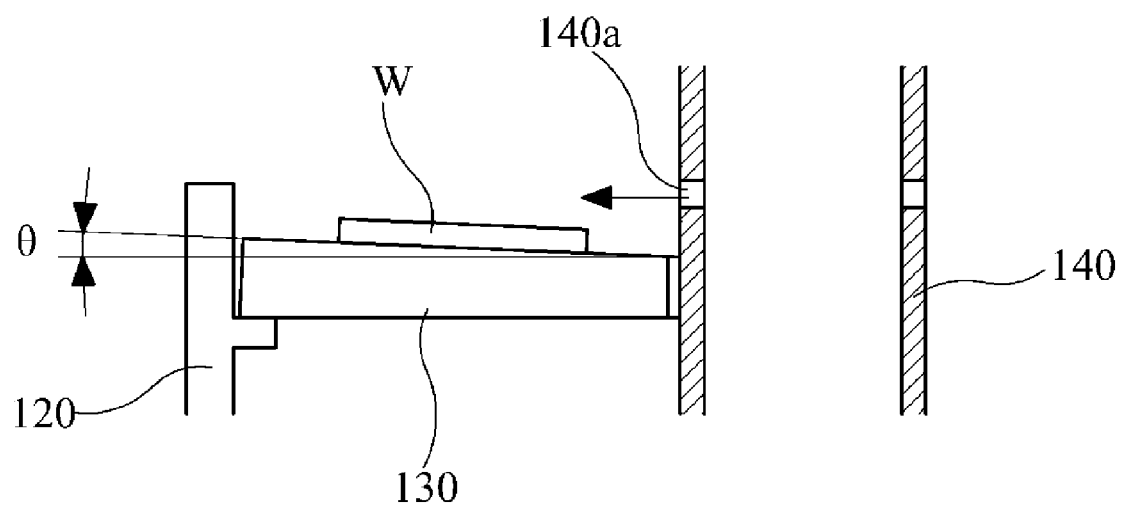
FIG. 4 is a cross-sectional view showing an inclined top surface of the susceptor of FIG. 2.

Meanwhile, to form a uniform film on the wafer W, as shown in FIG. 4, the ejection nozzles 140a may be formed to eject the process gas horizontally. In addition, in each susceptor 130, a surface on which the wafer W is loaded may be inclined upwardly from the center of the susceptor 130 to the side edge. Here, the inclination angle θ of each susceptor 130 may be set to form a uniform film on the wafer W. In this case, only the region on the surface of the susceptor 130 on which the wafer W is placed may be inclined, but the entire top surface of the susceptor 130 may be inclined as shown in FIG. 3.

Since the wafers W are arranged along the circumference of the supply pipe 140, if the process gas ejected from the ejection nozzles 140a is applied in parallel to the top surfaces of the wafers W, a region of each wafer W distant from the ejection nozzles 140a may be provided with less process gas than a region close to the ejection nozzles 140a. However, each wafer W is disposed to be inclined upwardly toward the outer edge, and thus the process gas is capable of staying longer on the region distant from the ejection nozzles 140a. Thus, the process gas can be uniformly provided on the wafer W, so that a uniform film can be formed on the wafer W.

Figure 5:
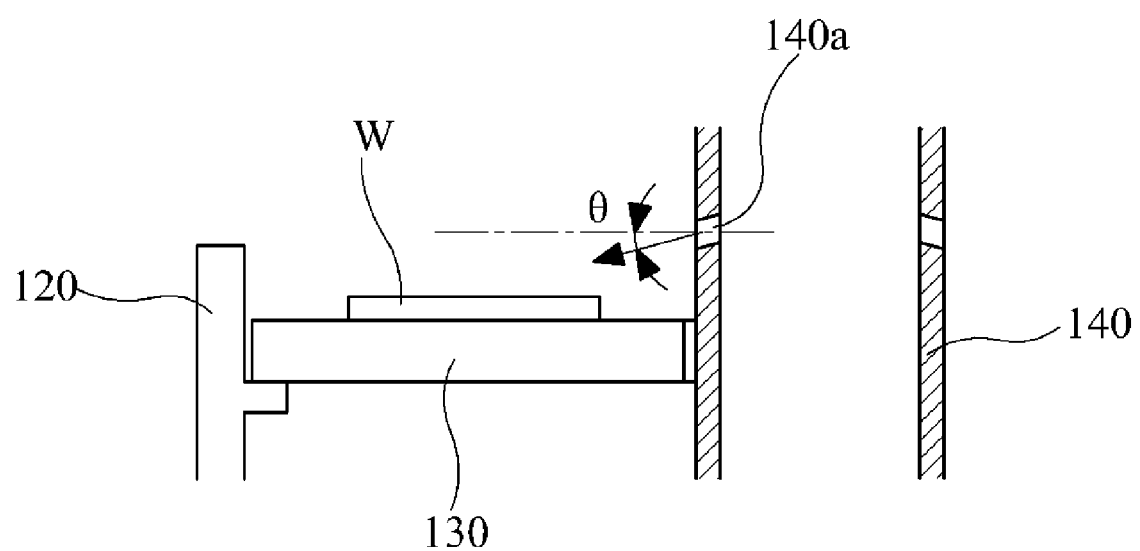
FIG. 5 is a cross-sectional view showing an inclined ejection direction of an ejection nozzle of FIG. 2.

As another example, to form a uniform film on each wafer W, as shown in FIG. 5, the susceptors 130 may have horizontal surfaces on which the wafers W are loaded, and the ejection nozzles 140a may be formed to eject the process gas at a predetermined angle toward the susceptors 130. Here, the inclination angle θ of the ejection nozzles 140a may be set to form the uniform film on each wafer W. The effect of the inclination is the same as described above.

As yet another example, although not illustrated, a region of each susceptor 130 on which the wafer W is loaded is inclined upwardly from the center to the edge of the susceptor 130, and the ejection nozzles 140a may be formed to eject the process gas at a predetermined angle to each susceptor 130. In this case, the inclination angle of the susceptor 130 and the inclination angle of the ejection nozzles 140a may also be set to form a uniform film on each wafer W.

Figure 6:
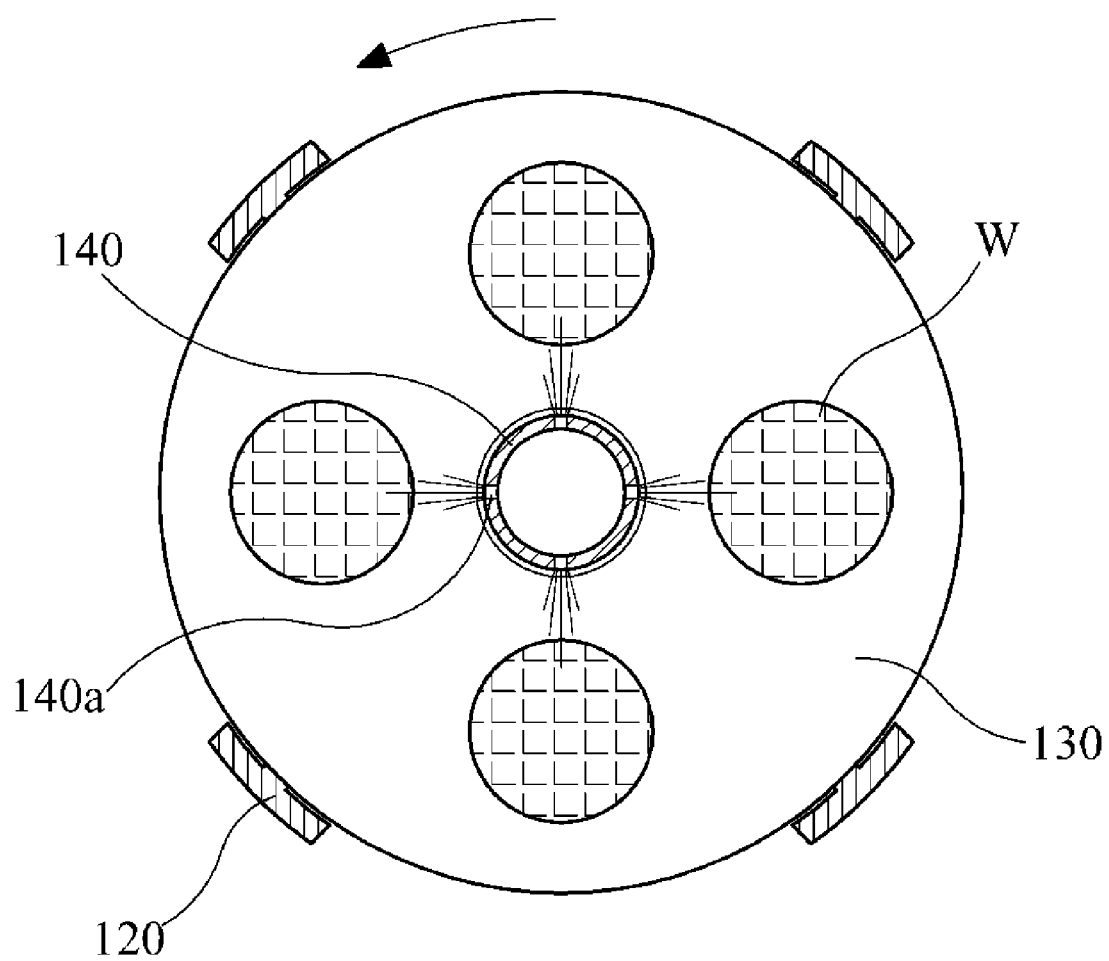
FIG. 6 is a plan view showing how the susceptor of FIG. 2 rotates along with the boat with respect to the supply pipe.

The boat 110 may be rotated by a rotation device (not shown) as illustrated in FIG. 6. For example, the boat 110 may be coupled with the rotation device to rotate. Due to the rotation of the boat 110, the susceptors 130 may be capable of being rotated with respect to the supply pipe 140. Accordingly, the process gas ejected from the ejection nozzles 140a may be able to be evenly provided to the wafers W which are rotated while on the susceptors 130.

When the susceptors 130 are rotated, the process gas ejected from the ejection nozzles 140a is likely to flow towards the outer edge of the susceptor 130 due to a rotational centrifugal force. In this case, because the centers of the respective wafers W are located off the rotation center of the susceptors 130, the process gas may not be evenly provided to the wafers W. Thus, the thickness of the film formed on each wafer W may be differed according to whether a region of the film is close to or distant from the center of the susceptor 130. That is, the film may not be formed with a uniform thickness on the wafers W.

To overcome the above problem, as shown in FIG. 2, a supplementary supply pipe 160 may be further included in the tube 110 to additionally provide the process gas. The supplementary supply pipe 160 supplements the process gas to the wafers W located at the outer edge of each susceptor 130, so that the films can be formed with a uniform thickness on the wafers W. The supplementary supply pipe 160 includes ejection nozzles 160a. The ejection nozzles 160a may be formed on the supplementary supply pipe 160 to eject the process gas onto the top surfaces of the susceptors 130.

The baffle 150 may be interposed between the tube 110 and the boat 120 to guide the residual gas in the tube 110 to the drain outlet 103. The baffle 150 guides the residual gas, which is left after forming the films on the wafers W, to the drain outlet 103.

The baffle 150 may be formed in a cylinder shape with upper and lower open ends. The baffle 150 has the upper open end apart from the tube 110 and the lower open end fixed to the is flange 111 to form a space with an open top and a closed bottom between the baffle 150 and the tube 110. The drain outlet 103 may be formed on the lower portion of the space between the baffle 150 and the tube 110 and be open to the outside of the tube 110. Accordingly, residual gas is capable of being guided to the space between the baffle 150 and the tube 110, and then discharged externally through the drain outlet 103.

The baffle 150 may have a plurality of baffle holes 151 corresponding to the respective heights of the susceptors 130. For example, the baffle holes 151 may be positioned at the same height as the top surfaces of the susceptors 1360. Accordingly, the residual process gas left on the top surface of the susceptor 130 after forming the film on each susceptor 130 can be promptly discharged.

Figure 7:
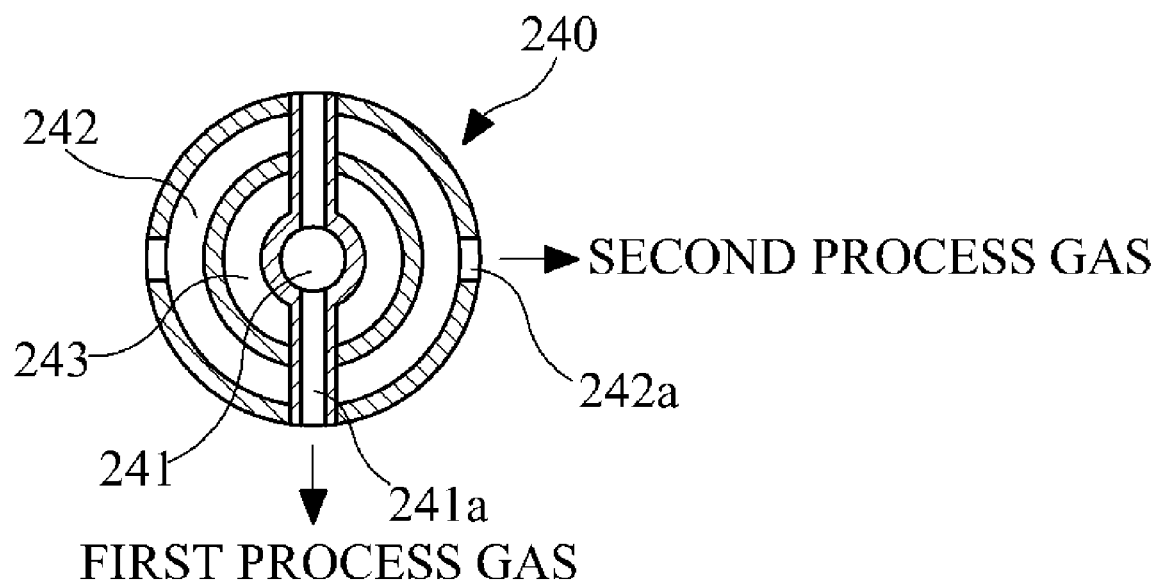
FIGS. 7 and 8 are a horizontal cross-sectional view and a vertical cross-sectional view of another example of the supply pipe shown in FIG. 2.
Figure 8:
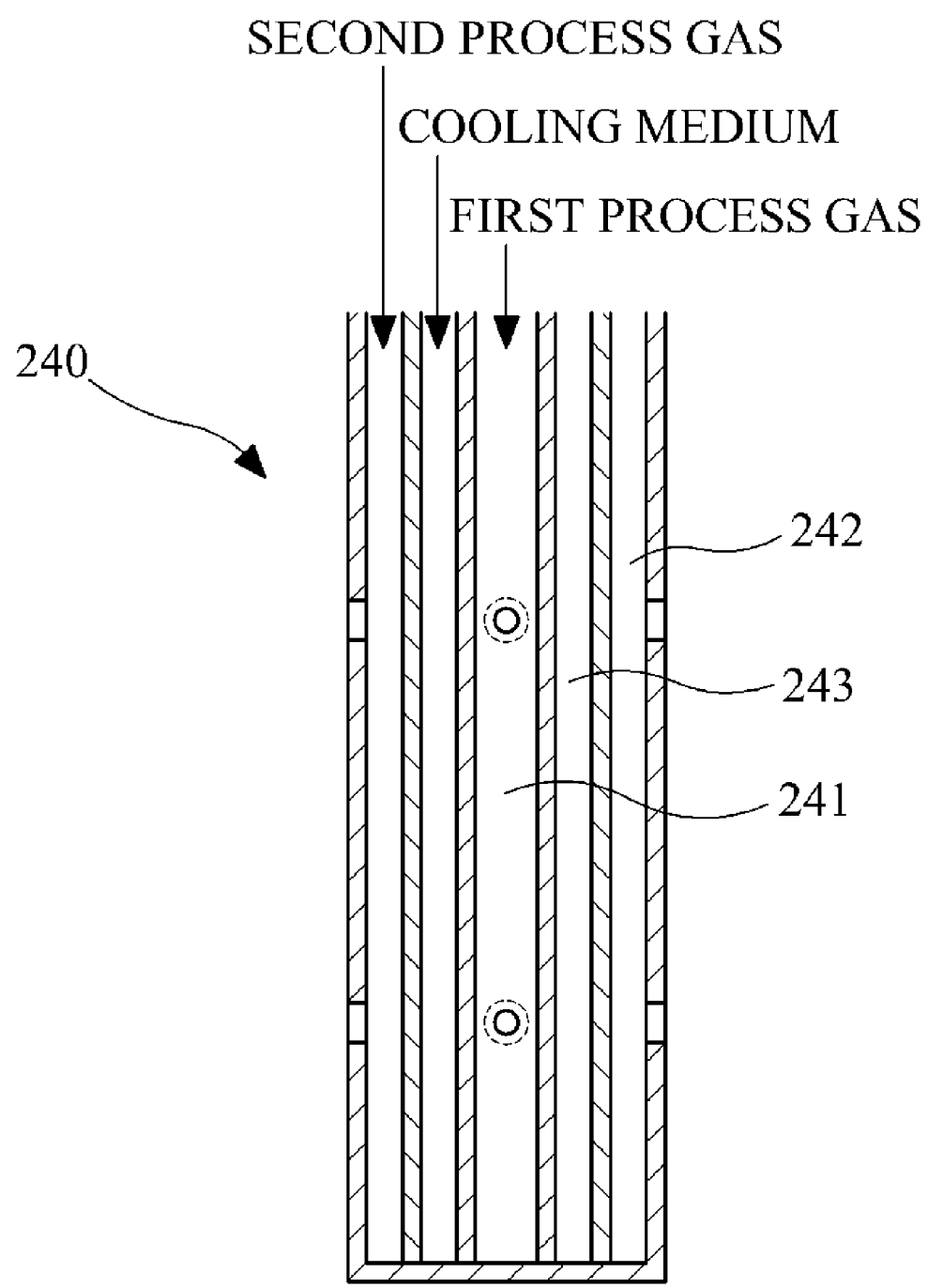

As shown in FIGS. 7 and 8, the supply pipe 240 may have a triple-pipe configuration, including a first supply channel 241, a second supply channel 242, and a third supply channel 243. The first to third supply channels 241, 242, and 243 may extend vertically, and be disposed concentrically. Here, the third supply channel 243 may be interposed between the first supply channel 241 and the second supply channel 242.

The first supply channel 241 may be provided with first process gas from an external source. In this case, the first supply channel 241 may have a first ejection nozzle 241a to eject the first process gas. The second supply channel 242 may be provided with second process gas from the external source. The second supply channel 242 may have a second ejection nozzle 242a to eject the second process gas.

The third supply channel 243 may be provided with cooling medium from an external source. The cooling medium may be a gas, a liquid, or a solid state. The cooling medium provided to the third supply channel 243 may prevent the first and second process gases from being dissociated while the first and second process gases are respectively flowing through the first and second supply channels 241 and 242.

When metal organic chemical vapor deposition (MOCVD) is performed in the tube 110 (see FIG. 2) and a Gallium Nitride (GaN) film is formed on each wafer W, the first process gas may be one of Trimethylgallium and ammonia, and the second process gas may be the other.

In the case described above, if the cooling medium is provided to the first supply channel 241 or the second supply channel 242, Trimethylgallium which requires to be refrigerated more than ammonia may be provided to the third supply channel 243 that is close to the cooling medium.

In implementations, the supplementary supply pipe may have a triple-pipe configuration, similar to the supply pipe which has a triple-pipe configuration as described above. Alternatively, the supply pipe and the supplementary supply pipe may have a single-pipe configuration or a double-pipe configuration. For example, if process gases are mixed outside the tube and then the mixture of the process gases is provided to the tube, the supply pipe and the supplementary supply pipe may have a single pipe configuration, and if process gases are provided through individual supply channels, the supply pipe and the supplementary pipe may have a double-pipe configuration.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An apparatus for manufacturing a semiconductor, the apparatus comprising:
    a tube configured to have a process space inside and a drain outlet at one end;
    a boat configured to be moved in and out of the tube through a open lower portion of the tube;
    a plurality of susceptors configured to be arranged in the boat apart from one another in a vertical direction, and each having a center hole on a center of rotation and having a top surface on which a plurality of wafers are loaded around a center; and
    a supply pipe configured to be installed to penetrate the center hole of each susceptor from a top of the boat and to have ejection nozzles, each ejecting a process gas provided from an external source to the top surface of each susceptor.

2. The apparatus of claim 1, wherein the ejection nozzles are configured to eject the process gas horizontally and portions on the top surface of each susceptor, each on which the wafer is loaded, are inclined upwardly toward an outer edge of the susceptor such that a uniform film is formed on each wafer.

3. The apparatus of claim 1, wherein portions on the top surface of each susceptor, each on which the wafer is loaded, are formed horizontally and the ejection nozzles are formed to eject the process gas to the susceptors at an angle to form a uniform film on each wafer.

4. The apparatus of claim 1, wherein the boat is configured to be rotated by a rotation device so that the susceptors can rotate with respect to the supply pipe.

5. The apparatus of claim 4, further comprising:
a supplementary supply pipe configured to additionally provide a process gas inside the tube.

6. The apparatus of claim 5, wherein the supplementary supply pipe is configured to have a triple-pipe configuration including a first supply channel to provide a first process gas, a second supply channel to provide a second process gas, and a third supply channel to provide a cooling medium wherein the first, second and third supply channels are disposed concentrically.

7. The apparatus of claim 1, wherein the supply pipe is configured to have a triple-pipe configuration including a first supply channel to provide a first process gas, a second supply channel to provide a second process gas, and a third supply channel to provide a cooling medium wherein the first, second and third supply channels are disposed concentrically.

* * * * *